United States Patent
Larson

(10) Patent No.: US 6,827,595 B2
(45) Date of Patent: Dec. 7, 2004

(54) EJECTOR LATCH CONNECTOR

(75) Inventor: Thane M. Larson, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 24 days.

(21) Appl. No.: 10/192,400

(22) Filed: Jul. 9, 2002

(65) Prior Publication Data

US 2004/0009692 A1 Jan. 15, 2004

(51) Int. Cl.[7] .............................................. H01R 13/62
(52) U.S. Cl. ..................................................... 439/160
(58) Field of Search ................................ 439/157, 160, 439/327, 328, 911; 361/754

(56) References Cited

U.S. PATENT DOCUMENTS

| | | | | |
|---|---|---|---|---|
| 5,211,568 A | * | 5/1993 | Yamada et al. | 439/157 |
| 5,253,140 A | * | 10/1993 | Inoue et al. | 361/728 |
| 5,387,115 A | * | 2/1995 | Kozel et al. | 439/157 |
| 5,389,000 A | * | 2/1995 | DiViesti et al. | 439/157 |
| 5,822,196 A | * | 10/1998 | Hastings et al. | 361/801 |
| 5,846,095 A | * | 12/1998 | Bowen | 439/157 |
| 5,989,043 A | * | 11/1999 | Han et al. | 439/157 |
| 6,094,353 A | | 7/2000 | Koerber et al. | |
| 6,220,879 B1 | | 4/2001 | Ulrich | |
| 6,319,029 B2 | * | 11/2001 | Nishioka | 439/159 |

* cited by examiner

Primary Examiner—Thanh-Tam Le

(57) ABSTRACT

An ejector latch connector assembly for establishing an electrical connection between an ejector latch and a printed circuit board (PCB) is disclosed. In one embodiment, the present invention is comprised of an ejector latch. The present embodiment is further comprised of a compression-fit connector integrated with the ejector latch. The compression-fit connector adapted to provide a removably coupleable electrical connection between the ejector latch and a printed circuit board (PCB) such that inadvertent disconnection of the removably coupleable electrical connection between the ejector latch and the PCB is reduced.

19 Claims, 5 Drawing Sheets

(PRIOR ART) FIG 1

EJECTOR LATCH CONNECTOR

TECHNICAL FIELD

The present claimed invention relates to the field of computer chassis structures. More specifically, the present claimed invention relates to an ejector latch connector employed in conjunction with computer chassis structures.

BACKGROUND ART

Presently, hot-plug printed circuit assemblies (PCAs) are comprised of a substrate (e.g., PC board) with associated microcircuits, a bulkhead, and two ejector latches (for mounting the PCA to a chassis). Typically, PCAs are used in conjunction with chassis structures to allow a large amount of processing ability to fit into a small space. In general, the chassis structure may contain a multiplicity of PCAs operating independently, in conjunction, or as a portion of a larger network. Normally, the PCA is attached to the chassis type structure in conjunction with very specific standards. Typically, PCA attaching standards include, for example, the compact peripheral component interconnect (cPCI) standard, and the VersaModular Eurocard (VME) standard.

Typically, hot-plug PCAs used in the chassis type structure fabricated to one of the above-mentioned standards (e.g., cPCI or VME) have ejector latches that are utilized to provide attachment of the PCA with the chassis. In order to ensure correct attachment of the PCA with the chassis has occurred, an engaged/disengaged circuit is integrated with the ejector latch. Therefore, when the PCA is properly installed, the ejector latch circuit is closed and operation of the PCA may commence. However, if the PCA is incorrectly installed, then the ejector latch circuit will remain open and operation of the PCA may not commence. In addition, when an operational PCA is prepared for removal from the chassis, the ejector latches are disengaged. The disengagement of the ejector latch opens the ejector latch circuit and allows the PCB to prepare for removal from the chassis. For example, when the ejector latches are disengaged, the PCB may begin the process of shutting down in preparation for removal from the system.

With reference now to prior art FIG. 1, in order to allow the PCB to receive status information regarding the position of the ejector latch 110, a wiring harness 130 is used to electrically connect ejector latch 110 with the PCB. Wiring harness 130 is sometimes called a pigtail. The typical pigtail is integrated with ejector latch 110 on one end and has a connector 140 on the other. Connector 140 must be plugged into the PCB as part of the assembly process in order for the PCB to receive status information regarding the open or closed position of ejector latch 110.

In general, during the assembly of a PCA, the ejector latch is mounted partially to a bulkhead, and then the PCB is attached to the ejector latch. The PCB is then screwed into position with respect to both the bulkhead and the ejector latch. The pigtail from the ejector latch is then plugged into the PCB. On average, the length of the pigtail is one inch, therefore, the plug in location on the PCB must be somewhat close to both the ejector latch and the bulkhead.

One deleterious effect of utilizing the above stated pigtail to connect the ejector latch with the PCB is the requirement of plugging in the pigtail before inserting the PCA into the chassis. For example, during shipping of an assembled PCA the connection between the ejector latch and the PCB may become loose. If a user is unaware of the disconnection, the PCA mounted on the chassis may not operate due to a false open signal generated by the PCB. In such a condition, the user would be required to troubleshoot the PCA or hire a technician to troubleshoot the PCA in order to resolve the issue.

Another problem with the pigtail connector is the wear and tear of the wires in the pigtail. For example, the wear and tear associated with insertion or removal of the PCA from the chassis. Specifically, the wires may rub against other structures on the chassis (e.g., card guides, framework, other PCA's, etc.) or the PCA itself (e.g., locator pin, etc.) resulting in disconnection of the male end of the connector from the female end. Furthermore, the wear and tear on the wires may result in a short circuit between the wires resulting in a false open or closed ejector latch status. Additionally, the wear and tear may result in complete separation of a wire in the connector.

In addition to the disconnection problems mentioned above, there is no cPCI industry standard PCB plug-in location. That is, PCB designers may place the PCB connector for the ejector latch pigtail in a range of locations. Therefore, the expense and time or further custom manufacturing is required. For example, the designer may have a range of one-inch diameter in which the placement of the PCB connector for the ejector latch pigtail. Moreover, if a designer uses or designs a PCB for use with an ejector latch having a two-inch pigtail, then a user may be further limited to the type of ejector latches that may be used with a specific PCB.

Thus, the utilization of ejector latch connectors is non-standard, time-consuming, and lacks the desired "Design for Manufacturability."

DISCLOSURE OF THE INVENTION

The present invention provides an ejector latch connector method and apparatus which establishes a standard location for ejector latch connector assemblies. The present invention also provides an ejector latch connector method and apparatus which achieves the above accomplishment and which provides a reliable electrical connection between the ejector latch and the PCB. The present invention also provides an ejector latch connector method and apparatus which achieves the above accomplishments and which significantly reduces assembly requirements of a PCA. The present invention also provides an ejector latch connector method and apparatus which can be adapted to readily interface with industry standard components and meet industry standard specifications.

Specifically, an ejector latch connector assembly for establishing an electrical connection between an ejector latch and a printed circuit board (PCB) is disclosed. In one embodiment, the present invention is comprised of an ejector latch. The present embodiment is further comprised of a compression-fit connector integrated with the ejector latch. The compression-fit connector adapted to provide a removably coupleable electrical connection between the ejector latch and a printed circuit board (PCB) such that inadvertent disconnection of the removably coupleable electrical connection between the ejector latch and the PCB is reduced.

BRIEF DESCRIPTION OF THE DRAWINGS

The accompanying drawings, which are incorporated in and form a part of this specification, illustrate embodiments of the invention and, together with the description, serve to explain the principles of the invention.

PRIOR ART

The drawings referred to in this description should be understood as not being drawn to scale except if specifically noted.

BEST MODES FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

Figure 1:
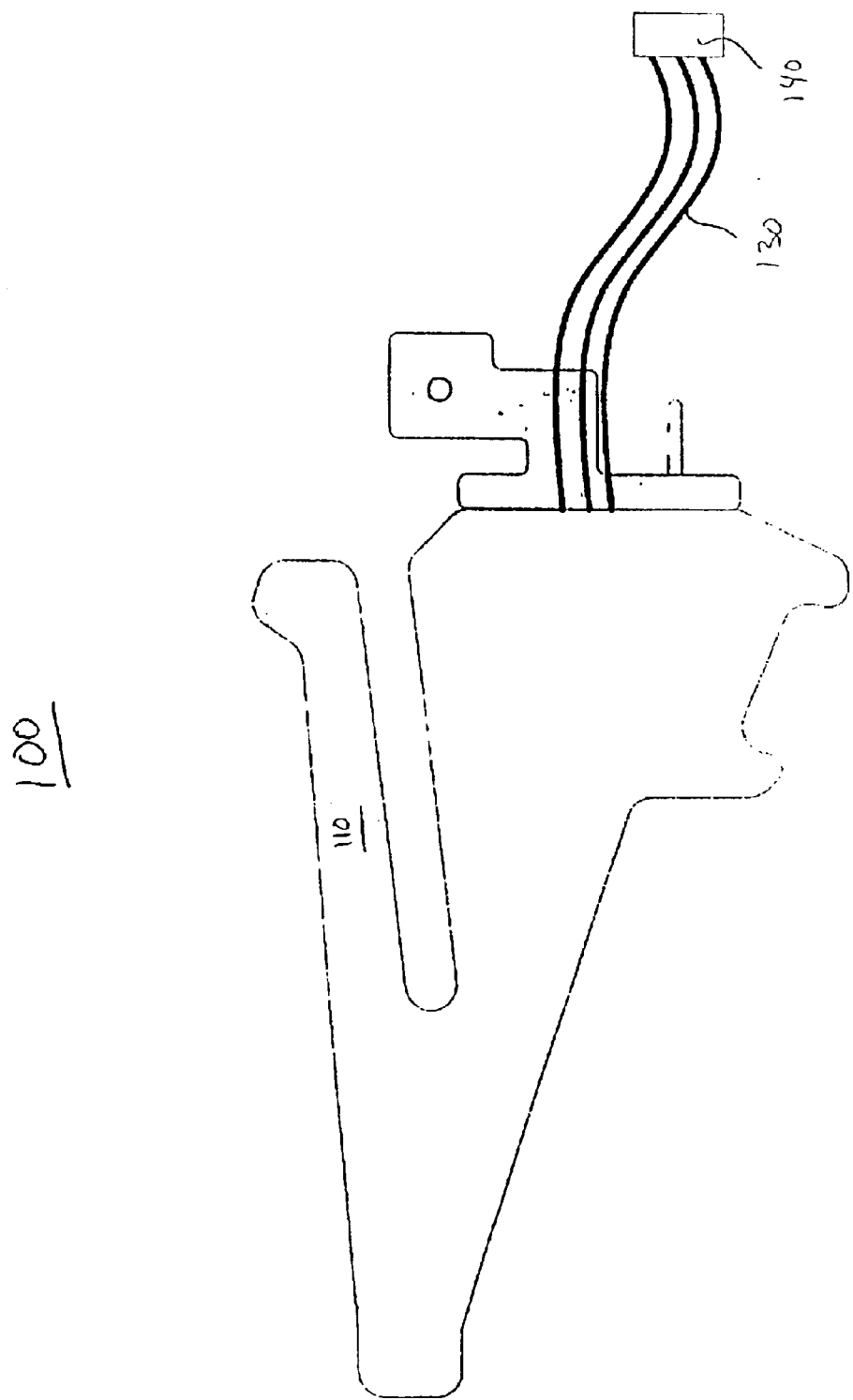
FIG. 1 is a side view of a conventional ejector latch connector assembly having a wiring harness requiring manual post-assembly connection.
Figure 2:
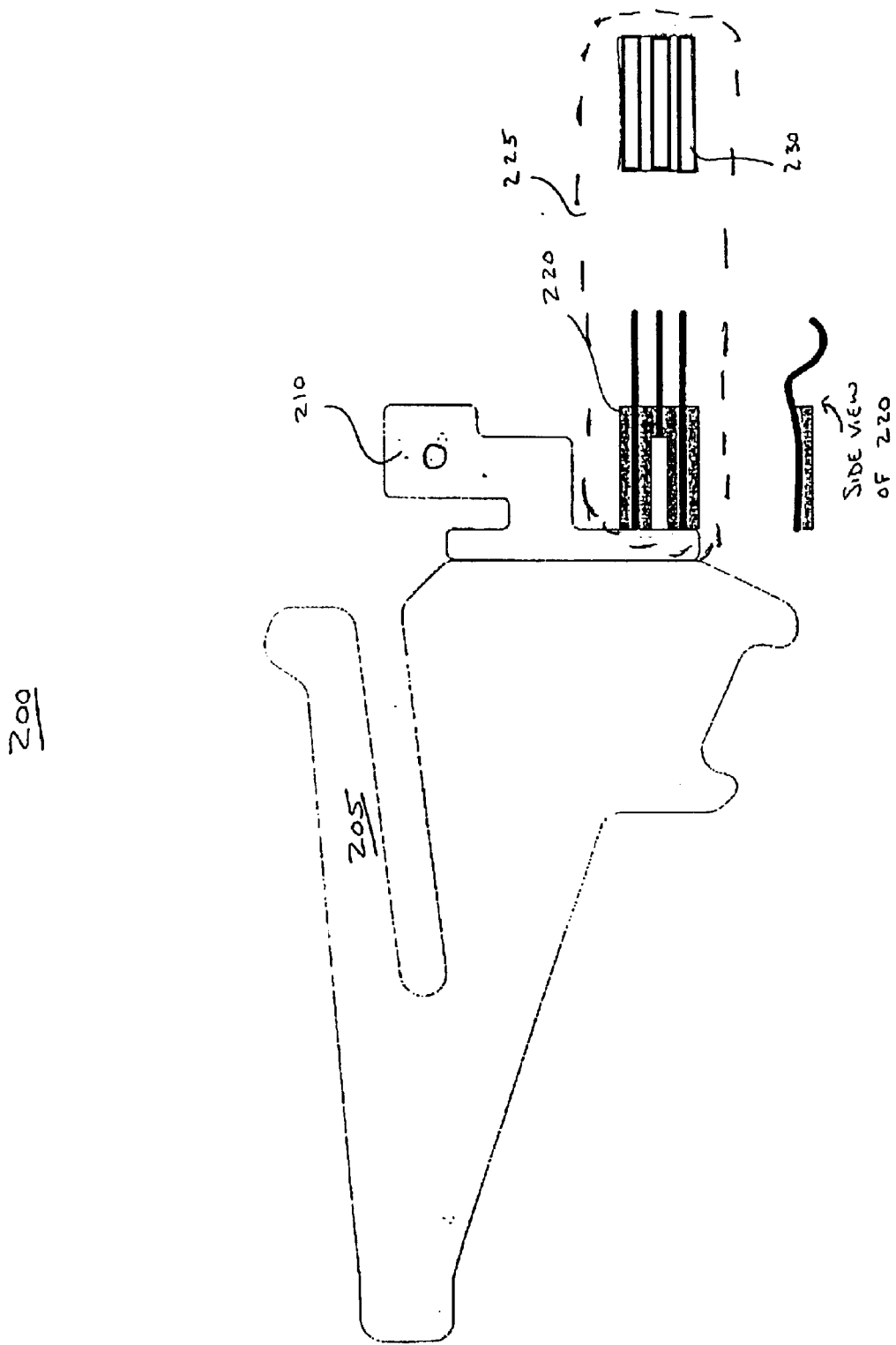
FIG. 2 is a side view of an ejector latch connector assembly in accordance with an embodiment of the present claimed invention.

With reference now to FIG. 2, a side view of an ejector latch connector assembly is shown in accordance with embodiments of the present claimed invention. The following discussion will begin with a detailed description of the physical characteristics of the present ejector latch connector assembly. The discussion will then contain a detailed description of the use and operation of the present ejector latch connector assembly. Regarding the physical structure of the present ejector latch connector assembly, for purposes of clarity, only one side of the ejector latch connector assembly (e.g., 200) is shown in FIG. 2. In the present embodiment ejector latch connector assembly 200 includes an ejector latch 205. Importantly, as will be discussed in detail below, in one embodiment, ejector latch 205 is formed having dimensions and characteristics which are in compliance with an industry standard such as, for example, the compact peripheral component interconnect (cPCI) standard, and the VersaModular Eurocard (VME) standard.

Referring again to FIG. 2, ejector latch connector assembly 200 also includes a compression-fit connector 225 that is integrated with ejector latch 205. In one embodiment, compression-fit connector 225 is a surface mount connector (SMT). Compression-fit connector 225 is ultimately employed as a removably coupleable electrical connection between ejector latch 205 and a printed circuit board (PCB) to which it is coupled. Although an SMT is specifically mentioned as compression-fit connector 225 in the present embodiment, compression-fit connector 225 is also well suited to use with various other types of compression-fit connectors. For purposes of brevity and clarity each of the numerous possibilities of compression-fit connectors are not shown in the present figures.

As shown in FIG. 2, compression-fit connector 225 is comprised of a pad portion 230, and an electrical wire 220.

As will be discussed herein in detail, in one embodiment (e.g., FIG. 2 and FIGS. 3A–3D), pad portion 230 is adapted to be coupled with PCB 330. Compression-fit connector 225 is adapted to provide a removably coupleable electrical connection between ejector latch 205 and PCB 330 such that inadvertent disconnection of the removably coupleable electrical connection between ejector latch 205 and PCB 330 is reduced.

In one embodiment, electrical wire 220 of compression-fit connector 225 is integrated with ejector latch 205. Furthermore, as shown in FIG. 2 (side view of electrical wire 220) electrical wire 220 is comprised of an S-shaped, stiff (gold plated berilium-copper) conducting portion for increasing connectivity with respect to pad portion 230. Although an S-shaped portion is shown, it is appreciated that electrical wire 220 may incorporate any type of bend and any type of material which may induce a better electrical connection. Furthermore, electrical wire 220 may be a straight wire thereby incorporating no bend for inducing a better electrical connection. Lastly, though three wires are shown in 220, the concept extends to an arbitrary number.

Referring still to FIG. 2, pad portion 230 may be comprised of several traces of copper. In addition, pad portion 230 may be comprised of copper that may be etched in different patterns and enhanced with mechanical guides to establish a better electrical connection with electrical wire 220. Although copper is mentioned as a material utilized for pad portion 230, any conductive material (e.g., silver, gold, platinum, or the like) may be used.

With reference still to FIG. 2, in one embodiment ejector latch connector assembly 200 also includes a fastener arm 210 integrated with ejector latch 205. Fastener arm 210 is employed to correctly position ejector latch 205 with bulkhead 320 and PCB 330, of FIG. 3. In one embodiment, fastener arm 210 may utilize a screw to fasten ejector latch 205 with PCB 330. As illustrated in FIGS. 3A through 3D, fastener arm 210 correctly positions ejector latch 205 with PCB 330 thus allowing electrical wire 220 to establish an electrical connection with pad portion 230.

Use and Operation

Figure 3A:
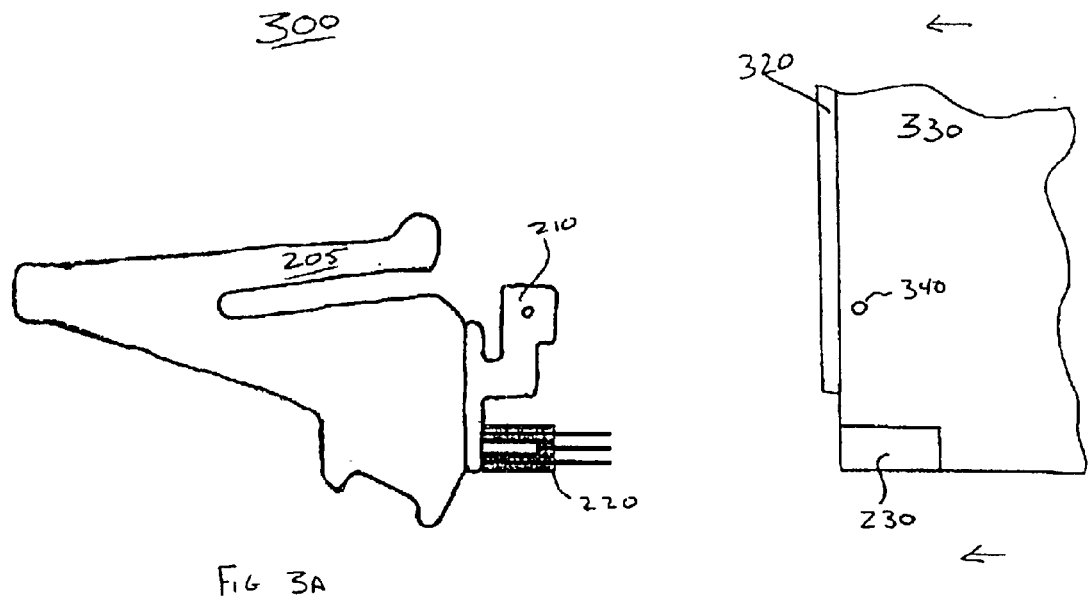
FIGS. 3A through 3D are side views of an exemplary coupling process of an ejector latch connector assembly with a bulkhead and a printed circuit board in accordance with an embodiment of the present claimed invention.

The following is a detailed description of the use and operation of the present ejector latch connector assembly. With reference now to FIG. 3A, in one embodiment, compression-fit connector 225 is integrated with an ejector latch such as ejector latch 205 and a PCB such as PCB 330. In one embodiment (e.g., FIG. 3), electrical wire 220 of compression-fit connector 225 is integrated with ejector latch 205 below fastener arm 210. Moreover, pad portion 230 is coupled with PCB 330 in a position such that a further step of connecting the electrical connection between ejector latch 205 and PCB 330 is not required. That is, due to the placement of electrical wire 220 and pad portion 230 upon assembly of the PCA (e.g., attaching bulkhead 320 with ejector latch 205 and PCB 330) the compression-fit connector establishes a removably coupleable electrical connection. It is appreciated that only a portion of both bulkhead 320 and PCB 330 are shown in the present embodiments. It is further appreciated that most PCA's have two ejector latch 205's attached thereon. However, for purposes of brevity and clarity only one ejector latch 205 is shown.

Importantly, the present invention is well suited to electrically coupling ejector latch 205 with PCB 330 in order that a signal from ejector latch 205 may be received by PCB 330. In addition, the present embodiment further allows the location of compression-fit connector 225 to become an industry standard. Therefore, unlike prior art approaches, the present embodiment does not arbitrarily choose the location of the electrical wire receptor (e.g., pad portion 230) on PCB 330. In addition, unlike prior art approaches, the present embodiment does not require post assembly connection of an electrical wire between an ejector latch 205 and PCB 330 in order to establish an electrical connection between ejector latch 205 and PCB 330. Instead, the present embodiment allows customers to realize the beneficial reduced maintenance achieved with the present embodiment.

With reference now to FIGS. 3A through 3D, one embodiment of an exemplary coupling process of an ejector latch connector assembly with a bulkhead and a printed circuit board is shown. Specifically, with reference to FIG. 3A, PCA 300 is comprised of ejector latch 205, bulkhead 320, PCB 330 and compression-fit connector 225. Additionally, bulkhead 330 includes a fastening portion 340 for removably coupling with fastener arm 210. Although bulkhead 320 and PCB 330 are shown as being coupled together first, this is done merely for purposes of brevity and clarity. In fact, bulkhead 320 and PCB 330 may not be coupled together first but instead ejector latch 205 and bulkhead 320 may be coupled together first.

Figure 3B:
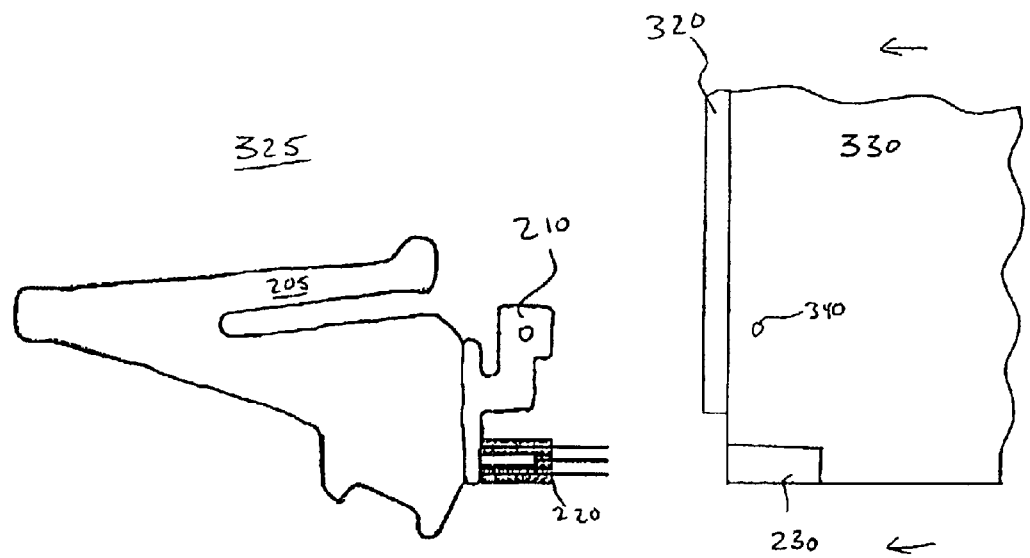
Figure 3C:
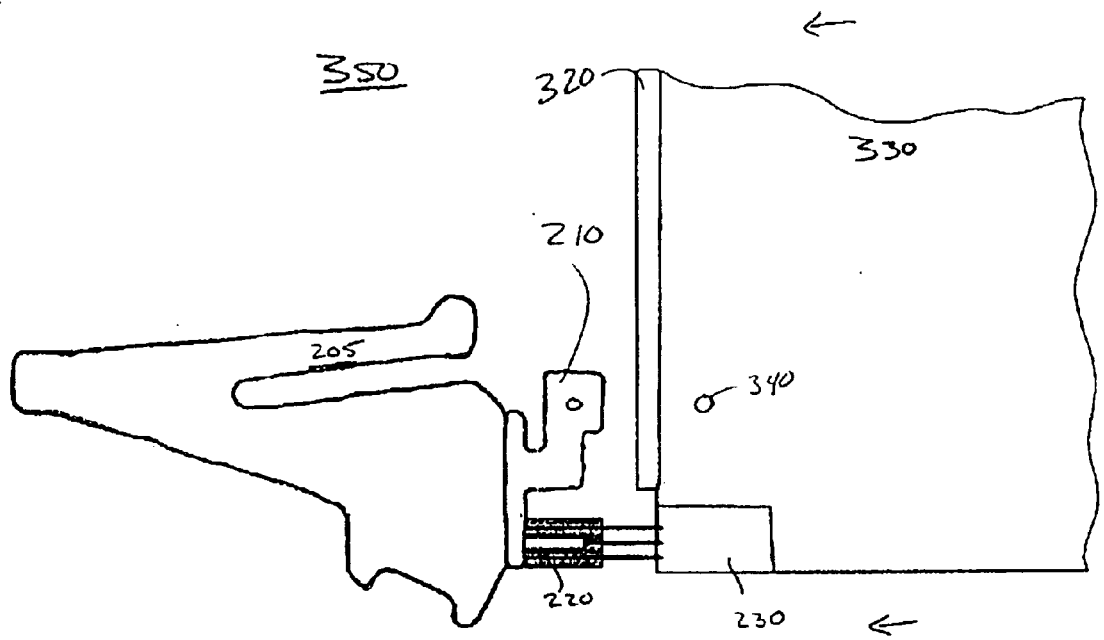

Referring now to FIGS. 3B and 3C, bulkhead 320 and PCB 330 are shown approaching the point of coupling with ejector latch 205. With reference to FIG. 3C, PCA 350 shows electrical wire 220 making initial contact with pad portion 230 previous to the complete coupling of ejector latch 205 with PCB 330. Therefore, the removably coupleable electrical connection is being established during the initial assembly of PCA 350.

Figure 3D:
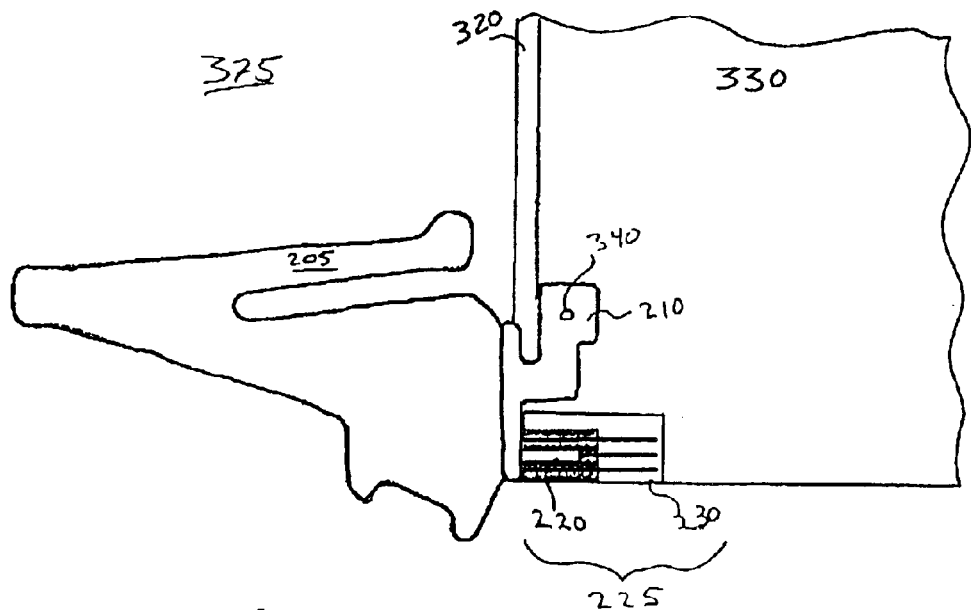

With reference now to FIG. 3D, PCA 375 is shown after all portions (e.g., ejector latch 210, bulkhead 320, and PCB 330) have been removably coupled therewith. Upon complete assembly, electrical wire 220 and pad portion 230 are electrically coupled via a compression-fit connection. Additionally fastener arm 210 is aligned with fastening portion 340 and removably coupled therewith. Thus, PCA 375 has been assembled and a concurrently coupled electrical connection has been established between ejector latch 205 and PCB 330 without the requirement of any additional assembly steps or user interaction. Therefore, the position of ejector latch 205 (e.g., open or closed) may now be detected by PCB 330 thus allowing correct operation of PCA 375. For example, in one embodiment when PCA 375 is inserted in a chassis and ejector latches 205 are engaged, PCB 330 will be able to operate within the system. In addition, when the ejector latches are disengaged (e.g., for hot swapping, maintenance of PCA 375, or the like) PCB 330 will be able to perform a shutdown prior to the removal from the chassis, thereby protecting PCA 375 from being removed from a chassis while it is still in operation.

Figure 4:
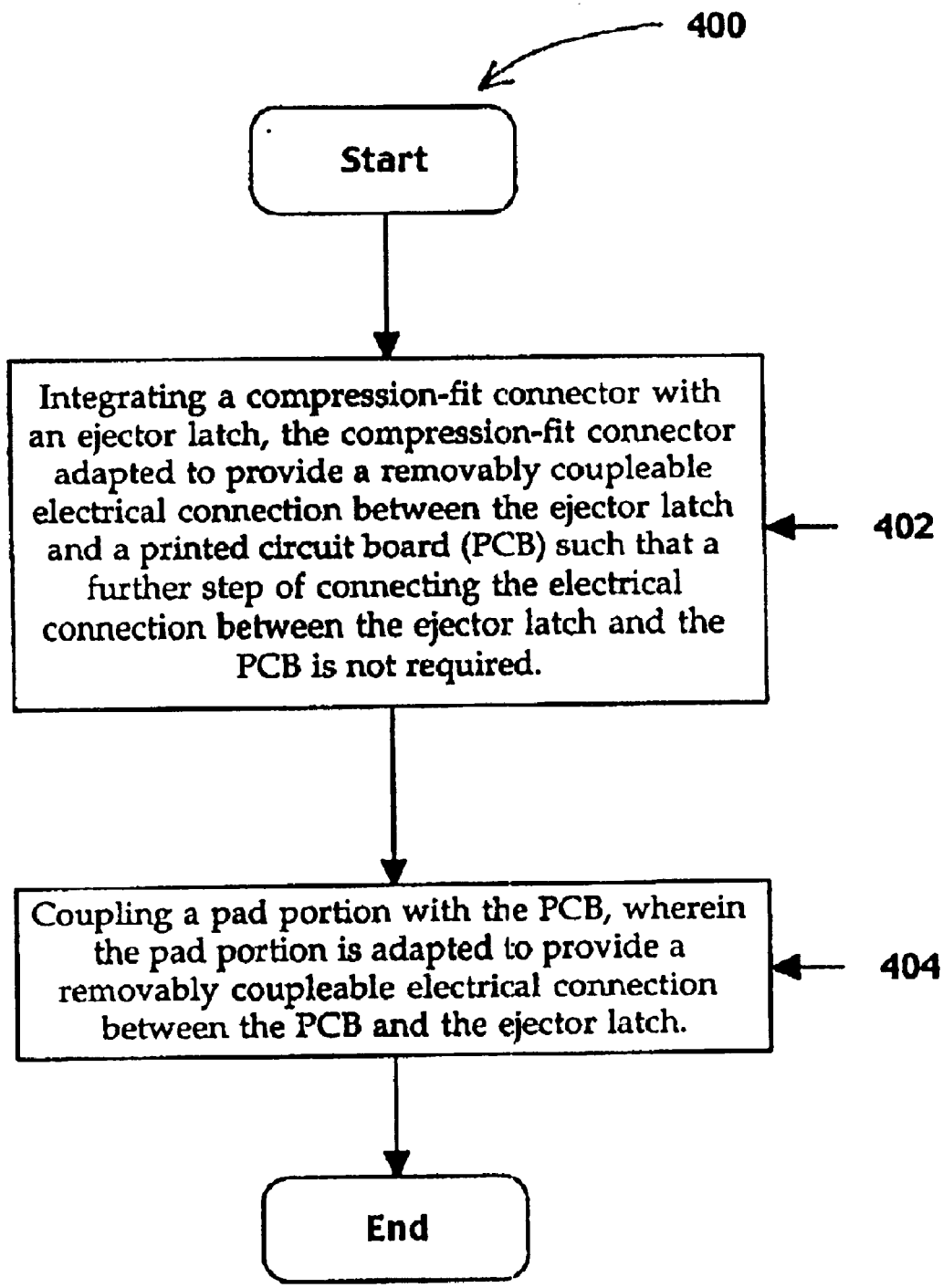
FIG. 4 is a flow chart of steps performed in accordance with one embodiment of the present claimed invention.

With reference now to FIG. 4, a flow chart 400 summarizing the steps performed in accordance with one embodiment of the present invention is shown. At step 402, the present embodiment integrates a compression-fit connector with an ejector latch. As described in detail herein, the compression-fit connector (e.g. compression-fit connector 225) is adapted to provide a removably coupleable electrical connection between ejector latch 205 and PCB 330 such that a further step of connecting the electrical connection between ejector latch 205 and PCB 330 is not required.

Next, at step 404, the present embodiment couples a pad portion 230 with PCB 330 wherein pad portion 230 is adapted to provide a removably coupleable electrical connection between PCB 330 and ejector latch 205.

Beneficially, the present embodiment eliminates the need to electrically couple each ejector latch of a PCA with the specific PCB after the coupling of the PCB with the ejector latch. Instead, the present embodiment allows PCA's to be assembled without concern for the subsequent electrical connection of ejector latches to the PCB being utilized. Furthermore, with the standardization of the compression-fit connector less custom manufacturing of the PCB is necessary. Thus, the present invention achieves a "Design for Manufacturability" lacking in the prior art. Additionally, by standardizing the location and increasing the reliability of compression fit connector 225, the present invention is extremely well suited to use in hot swapping environments.

Thus, the present invention provides an ejector latch connector method and apparatus which establishes a standard location for ejector latch connector assemblies. The present invention also provides an ejector latch connector method and apparatus which achieves the above accomplishment and which provides a reliable electrical connection between the ejector latch and the PCB. The present invention also provides an ejector latch connector method and apparatus which achieves the above accomplishments and which significantly reduces assembly requirements of a PCA. The present invention also provides an ejector latch connector method and apparatus which can be adapted to readily interface with industry standard components and meet industry standard specifications.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An ejector latch connector assembly comprising:

an ejector latch; and a compression-fit connector integrated with said ejector latch, said compression-fit connector adapted to provide a removably coupleable electrical connection between said ejector latch and a printed circuit board (PCB) such that inadvertent disconnection of said removably coupleable electrical connection between said ejector latch and said PCB is reduced, and wherein said compression-fit connector is comprised of:

a pad portion coupled with said PCB; and an electrical wire integrated with said ejector latch, said electrical wire removably coupleable with said pad portion, said electrical wire adapted to electrically couple said pad portion on said PCB with said ejector latch such that a signal from said PCB may be received by said ejector latch.

2. The ejector latch connector assembly of claim 1 wherein said compression-fit connector is a surface mount (SMT) connector.

3. The ejector latch connector assembly of claim 1 further comprising:

a plurality of said compression-fit connectors integrated with said ejector latch, said plurality of compression-fit connectors adapted to provide a removably coupleable electrical connection between said ejector latch and said PCB such that inadvertent disconnection of said removably coupleable electrical connection between said ejector latch and said PCB is reduced.

4. The ejector latch connector assembly of claim 1 wherein said ejector latch will couple with said PCB in accordance with a compact peripheral component interconnect (cPCI) standard.

5. The ejector latch connector assembly of claim 1 wherein said ejector latch will couple with said PCB in accordance with a VersaModular Eurocard (VME) standard.

6. The ejector latch connector assembly of claim 1 wherein said pad portion is comprised of copper.

7. The ejector latch connector assembly of claim 1 wherein said electrical wire of said compression-fit connector is comprised of an S-shaped portion for increasing connectivity with respect to said pad portion.

8. A method for establishing an electrical connection between an ejector latch and a printed circuit board (PCB) comprising:
   a) integrating a compression-fit connector with an ejector latch, said compression-fit connector adapted to provide a removably coupleable electrical connection between said ejector latch and a printed circuit board (PCB) such that a further step of connecting said electrical connection between said ejector latch and said PCB is not required and such that a signal from said PCB may be received by said compression-fit connector; and
   b) coupling a pad portion with said PCB, said pad portion adapted to provide a removably coupleable electrical connection between said PCB and said ejector latch.

9. The method as recited in claim 8 wherein said compression-fit connector is a surface mount (SMT) connector.

10. The method as recited in claim 8 wherein said step a) comprises integrating said compression-fit connector with said ejector latch such that said ejector latch will couple with said PCB in accordance with a compact peripheral component interconnect (cPCI) standard.

11. The method as recited in claim 8 wherein said step a) comprises integrating said compression-fit connector with said ejector latch such that said ejector latch will couple with said PCB in accordance with a VersaModular Eurocard (VME) standard.

12. The method as recited in claim 8 wherein said electrical connection is further comprised of:
   an S-shaped portion for increasing connectivity with respect to a pad portion on said PCB.

13. The method as recited in claim 12 wherein said pad portion is further comprised of copper.

14. An ejector latch connector assembly comprising:
   an ejector latch; and
   a compression-fit connector integrated with said ejector latch, said compression-fit connector adapted to provide a removably coupleable electrical connection between said ejector latch and a printed circuit board (PCB) such that said electrical connection between said ejector latch and said PCB is concurrently coupled during the attachment of said ejector latch with said PCB, said compression-fit connector comprised of:
      a pad portion coupled with said PCB; and
      an electrical wire integrated with said ejector latch, said electrical wire removably coupleable with said pad portion, said electrical wire adapted to electrically couple said pad portion on said PCB with said ejector latch such that a signal from said PCB may be received by said ejector latch.

15. The ejector latch connector assembly of claim 14 wherein said compression-fit connector is a surface mount (SMT) connector.

16. The ejector latch connector assembly of claim 14 wherein said ejector latch will couple with said PCB in accordance with a peripheral component interconnect (cPCI) standard.

17. The ejector latch connector assembly of claim 14 wherein said ejector latch will couple with said PCB in accordance with a VersaModular Eurocard (VME) standard.

18. The ejector latch connector assembly of claim 14 wherein said electrical wire of said compression-fit connector is comprised of an S-shaped portion for increasing connectivity with respect to said pad portion.

19. The ejector latch connector assembly of claim 14 wherein said pad portion is comprised of copper.

* * * * *